United States Patent [19]

Ohba et al.

[11] Patent Number: 5,043,603

[45] Date of Patent: Aug. 27, 1991

[54] INPUT BUFFER CIRCUIT

[75] Inventors: Atsushi Ohba; Kenji Anami, both of Itami, Japan

[73] Assignee: Mitsubishi Denki Kabushiki Kaisha, Tokyo, Japan

[21] Appl. No.: 462,056

[22] Filed: Jan. 8, 1990

Related U.S. Application Data

[63] Continuation of Ser. No. 236,725, Aug. 26, 1988, Pat. No. 4,910,425.

[30] Foreign Application Priority Data

Oct. 5, 1987 [JP] Japan ................................ 62-251928
Oct. 5, 1987 [JP] Japan ................................ 62-251929

[51] Int. Cl.[5] ........................................... H03K 19/086

[52] U.S. Cl. .................................... 307/455; 307/475; 307/561; 307/567

[58] Field of Search ............... 307/455, 467, 475, 557, 307/561, 564, 565, 567

[56] References Cited

U.S. PATENT DOCUMENTS 3,986,051 10/1976 Okada et al. .................... 307/567 X
4,409,498 10/1983 Dorler et al. .................. 307/455 X

FOREIGN PATENT DOCUMENTS 50-1682 1/1975 Japan .
50-1689 1/1975 Japan .
59-21129 2/1984 Japan .
59-54330 3/1984 Japan .

*Primary Examiner*—James B. Mullins
*Attorney, Agent, or Firm*—Oblon, Spivak, McClelland, Maier & Neustadt

[57] ABSTRACT

When an input terminal, which is connected to an input transistor, is opened, a transistor having an emitter connected to the input transistor conducts to supply constant current to a constant current source which is connected to the emitter of the input transistor. Therefore, load current of a reference circuit connected to the constant current source is not changed even if the input terminal is opened. As the result, current valves of all constant current sources receiving voltage from the reference circuit are not changed so that the internal circuit of a semiconductor integrated circuit device can be stably operated.

22 Claims, 9 Drawing Sheets

1 4 3 Q6 Q1 R2 8 9 Q3 Q4 12 7 5 11 Q5 Q2 R1 R7 2 6 10

INPUT BUFFER CIRCUIT

This is a continuation of application Ser. No. 07/236,725, filed on Aug. 26, 1988, now U.S. Pat. No. 4,910,425.

BACKGROUND OF THE INVENTION

1. Field of the Invention

The present invention relates to an improvement in an input stage of a semiconductor integrated circuit apparatus employing emitter-coupled logic (hereinafter referred to as ECL).

2. Description of the Background Art

FIG. 1 is a circuit diagram showing a conventional ECL circuit. A buffer circuit 1 is formed by a transistor $Q_1$ and a constant current source circuit 2. The transistor $Q_1$ is an emitter follower buffer NPN transistor. The transistor $Q_1$ has a base connected to an input terminal 3, a collector connected to a first power supply line 4 and an emitter connected to the constant current source circuit 2. The transistor $Q_1$ derives a signal which is responsive to an input signal received in the input terminal 3 at its emitter. The constant current source circuit 2 is a constant current load for supplying constant current to the transistor $Q_1$. The constant current source circuit 2 is formed by a transistor $Q_2$ and a resistor $R_1$. The transistor $Q_2$ is an NPN transistor, which has a base connected to a reference voltage input terminal 5, a collector connected to the emitter of the transistor $Q_1$ and an emitter connected to a second power supply line 6 through the resistor $R_1$.

An ECL differential pair 7 is formed by transistors $Q_3$ and $Q_4$. The transistors $Q_3$ and $Q_4$ are prepared by NPN transistors, emitters of which are commonly connected with each other. The transistor $Q_3$ has a base connected to the emitter of the transistor $Q_1$ and a collector connected to the first power supply line 4 through the resistor $R_2$ as well as to an output terminal 8. The transistor $Q_4$ has a base connected to a logic comparison reference voltage input terminal 9 and a collector connected to the first power supply line 4. The logic comparison reference voltage input terminal 9 is set at a potential value evaluated by adding the base-to-emitter potential of the transistor $Q_1$ to an intermediate potential between a high-level signal and a low-level signal supplied to the input terminal 3. The transistor $Q_3$ is made conductive/nonconductive depending on whether or not a signal level supplied to its base is higher than the potential of the logic comparison reference voltage input terminal 9, so that a high-level or low-level signal is outputted from the output terminal 8.

A constant current source circuit 10 is adapted to supply constant current to the ECL differential pair 7, and is formed by a transistor $Q_5$ and a resistor $R_3$. The transistor $Q_5$ is prepared by an NPN transistor, which has a base connected to the base of the transistor $Q_2$, a collector connected to the emitter common junction of the transistors $Q_3$ and $Q_4$ and an emitter connected to the second power supply line 6 through a resistor $R_7$.

Operation of the circuit in the aforementioned structure will now be described. When the input terminal 3 receives a high-level signal, the transistor $Q_3$ of the ECL differential pair 7 is supplied in its base with a high-level signal which is higher than the potential at the logic comparison reference voltage input terminal 9 through the buffer transistor $Q_1$, whereby the transistor $Q_3$ enters a conducting state and the transistor $Q_4$ enters a nonconducting state. Current flows to the resistor $R_2$ to cause voltage drop, and hence a low-level signal is outputted from the output terminal 8.

When the input terminal 3 receives a low-level signal, on the other hand, the transistor $Q_3$ of the ECL differential pair 7 is supplied in its base with a low-level signal which is lower than the potential at the logic comparison reference voltage input terminal 9 through the buffer transistor $Q_1$, whereby the transistor $Q_3$ enters a nonconducting state and the transistor $Q_4$ enters a conducting state. Since no current flows to the resistor $R_2$ to cause no voltage drop in this case, a high-level signal is outputted from the output terminal 8.

As hereinabove described, the transistor $Q_1$ is regularly in a conducting state when a high-level or low-level signal is received in the input terminal 3, to level-shift the potential of the high-level or low-level signal by its base-to-emitter voltage to derive the same at the emitter. In such a normal operation state, current to the constant current source circuit 2 is supplied from the first power supply line 4. Assuming that the constant current supplied to the constant current source circuit 2 is represented by $I_0$ and the grounded emitter current amplification factor of the transistor $Q_2$ is 100, current of $I_0/100$ is supplied to the base of the transistor $Q_2$ from a reference circuit (not shown).

FIG. 2 is a circuit diagram showing another conventional ECL circuit, wherein the constant current source circuit 2 shown in FIG. 1 is formed by a current mirror circuit. The constant current source circuit 2 comprises a transistor $Q_2$, a resistor $R_3$ and a diode $D_1$. The diode $D_1$ is equivalent to a transistor whose base and collector are interconnected with each other. The transistor $Q_2$ has a base connected to a reference voltage input terminal 5 through the resistor $R_3$ as well as to a second power supply line 6 through the diode $D_1$ and an emitter connected to the second power supply line 6. This structure is so designed that a reference circuit (not shown), which is connected to the reference voltage input terminal 5, has reference voltage of $V_{REF}$ and supplies reference current of $I_{01}$ $\{I_{01}=(-V_{REF}-V_{F(D1)})/R_3\}$. $V_{F(D1)}$ shows a voltage drop of diode $D_1$.

In the conventional semiconductor integrated circuit device having the aforementioned structure, the transistor $Q_1$ enters a nonconducting state when the input terminal 3 is opened, whereby the constant current $I_0$ to the constant current source circuit 2 cannot be supplied from the first power supply line 4. Thus, no collector current flows in the transistor $Q_2$. Therefore, the transistor $Q_2$ operates as a diode formed by the base and the emitter. Thus, load current of the reference circuit, which is base current of the transistor $Q_2$ in the circuit shown in FIG. 1, is increased from $I_0/100$ $I_0$, whereby output voltage of the reference circuit is changed. In the circuit shown in FIG. 2, on the other hand, the current $I_{01}$ flowing in the diode $D_1$ is divided by the diode $D_1$ and the transistor $Q_2$, to cause change in the anode potential of the diode $D_1$, which is reference voltage of the constant current circuit 10. Consequently, all of the constant current sources receiving these reference voltages are changed in current value, to cause deviation in potential of an internal circuit when the semiconductor integrated circuit device is used under the condition that the input terminal 3 is opened.

SUMMARY OF THE INVENTION

The present invention provides an input buffer circuit for buffering an input signal to a desired circuit, wherein the input buffer circuit and the desired circuit are formed as a semiconductor integrated circuit device. The inventive input buffer circuit comprises first and second power sources; a buffer transistor having a base which is supplied with the input signal, a first electrode connected to the first power source and a second electrode from which a signal responsive to the input signal is derived to be supplied to the desired circuit; a first constant current source connected between the second electrode of the buffer transistor and the second power source as a current load; a third power source connected to the first constant current source as a reference for defining a current flowing in the first constant current source; and a clamp circuit for clamping a potential of the second electrode of the buffer transistor or a control electrode or the base of the buffer transistor at a predetermined potential level.

Accordingly, it is an object of the present invention to provide an input buffer circuit employed for a semiconductor integrated circuit device, which causes no change in value of current flowing to a constant current source even if the input buffer circuit is used under the condition that its input terminal is opened, so that an internal circuit is subjected to no potential deviation to perform stable operation.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
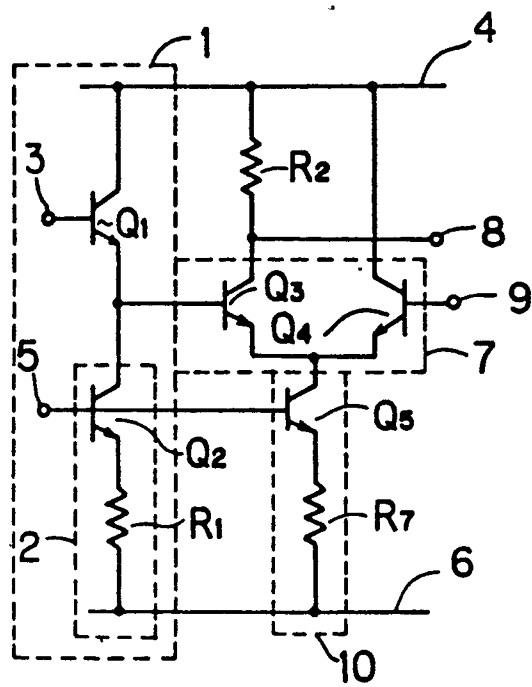
FIG. 1 and FIG. 2 are circuit diagrams showing conventional input buffer circuits.
Figure 3:
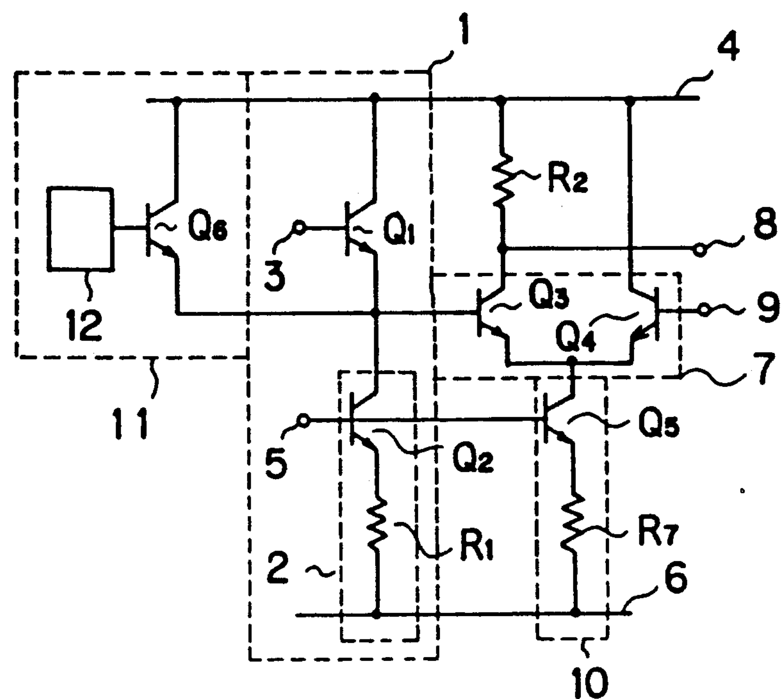
FIG. 3 is a circuit diagram showing an embodiment of the present invention.

FIG. 3 is a circuit diagram showing an embodiment of an input buffer circuit according to the present invention. The circuit is formed as a semiconductor integrated circuit device. This embodiment is different from the conventional ECL circuit of FIG. 1 in such a point that a clamp circuit 11 is connected to an emitter of a transistor $Q_1$, for clamping the emitter potential of the transistor $Q_1$ at a predetermined potential level. The clamp circuit 11 is formed by a transistor $Q_6$ and a constant voltage source 12. The transistor $Q_6$ is a clamp NPN transistor, which has a base connected to the constant voltage source 12, a collector connected to a first power supply line 4 and an emitter connected to the emitter of the transistor $Q_1$ respectively. An output potential of the clamp circuit 11, i.e., the emitter potential of the transistor $Q_6$ is set at a level lower than a low-level signal which may be received in an input terminal 3, to exert no influence on output.

Operation of the circuit is the aforementioned structure will now be described. When a high-level or low-level signal is inputted in the input terminal 3, only the transistor $Q_1$ conducts while the transistor $Q_6$ enters a nonconducting state since the transistors $Q_1$ and $Q_6$ form an ECL differential pair. Thus, the operation in this case is similar to that of the conventional ECL circuit shown in FIG. 1.

When the input terminal 3 is opened, the transistor $Q_1$ is made nonconductive while the transistor $Q_6$ is made conductive, whereby the emitter potential of the transistor $Q_1$ is clamped at the output potential of the clamp circuit 11. Therefore, constant current $I_0$ to a constant current source circuit 2 is supplied through the transistor $Q_6$. Thus, assuming that the grounded emitter current amplification factor of a transistor $Q_2$ is 100, current of $I_0/100$ is supplied to the base of the transistor $Q_2$ from a reference circuit (not shown) which is connected to a reference voltage input terminal 5, similarly to the case of inputting a high-level or low-level signal in the input terminal 3, even if the input terminal 3 is opened. Thus, base current of the transistor $Q_2$, which is load current of the reference circuit, is not changed even if the semiconductor integrated circuit device is used under the condition that the input terminal 3 is opened. Therefore, reference voltage inputted in the reference voltage input terminal 5 is not changed but remains constant, whereby current values of all constant current source circuits, including a constant current source circuit 10, to which the reference voltage is applied, remain constant. As the result, the semiconductor integrated circuit device can be stably operated with no regard to the state of connection of the input terminal 3.

Figure 2:
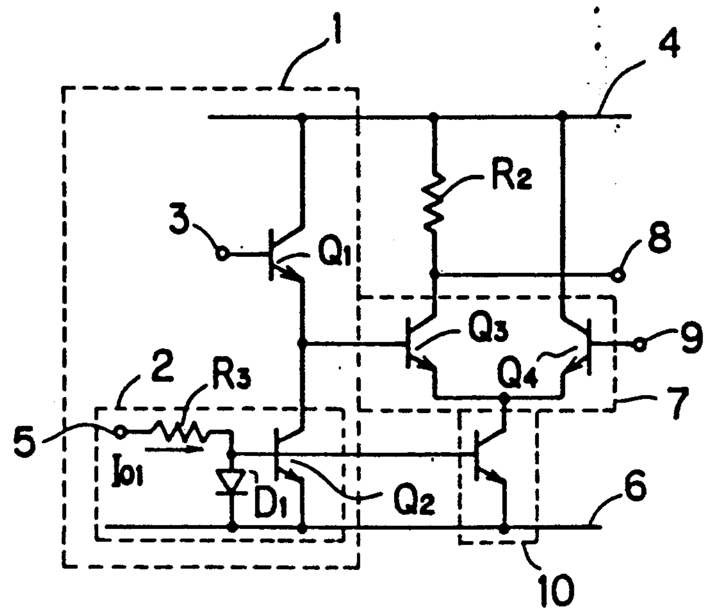
Figure 12:
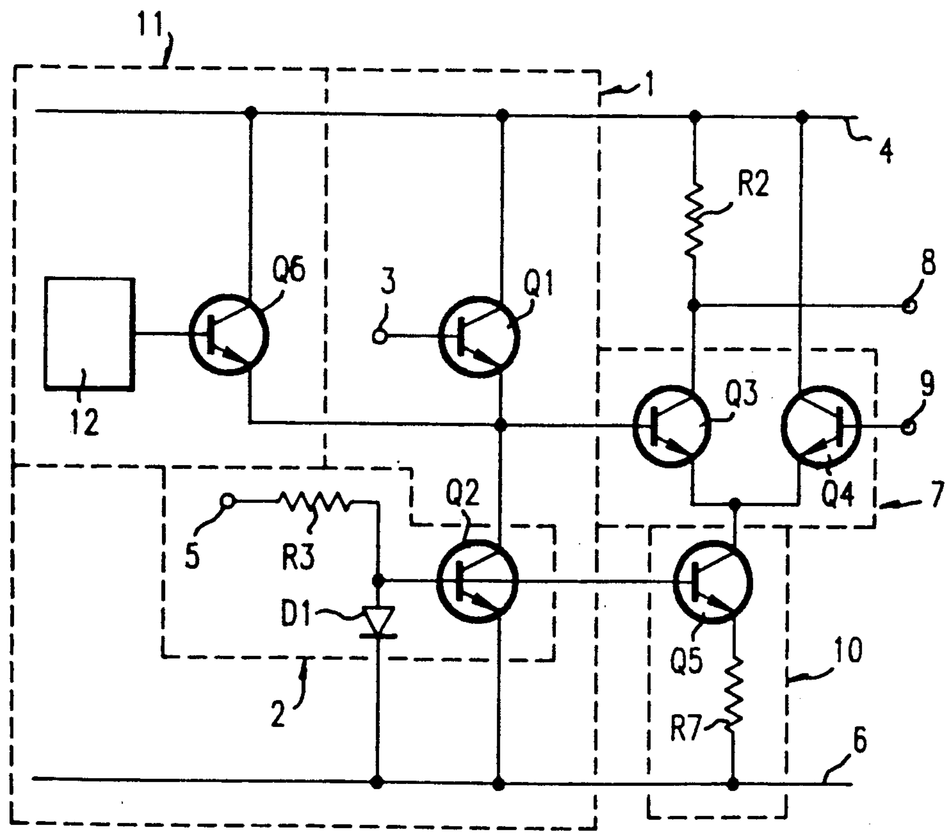
Figure 13:
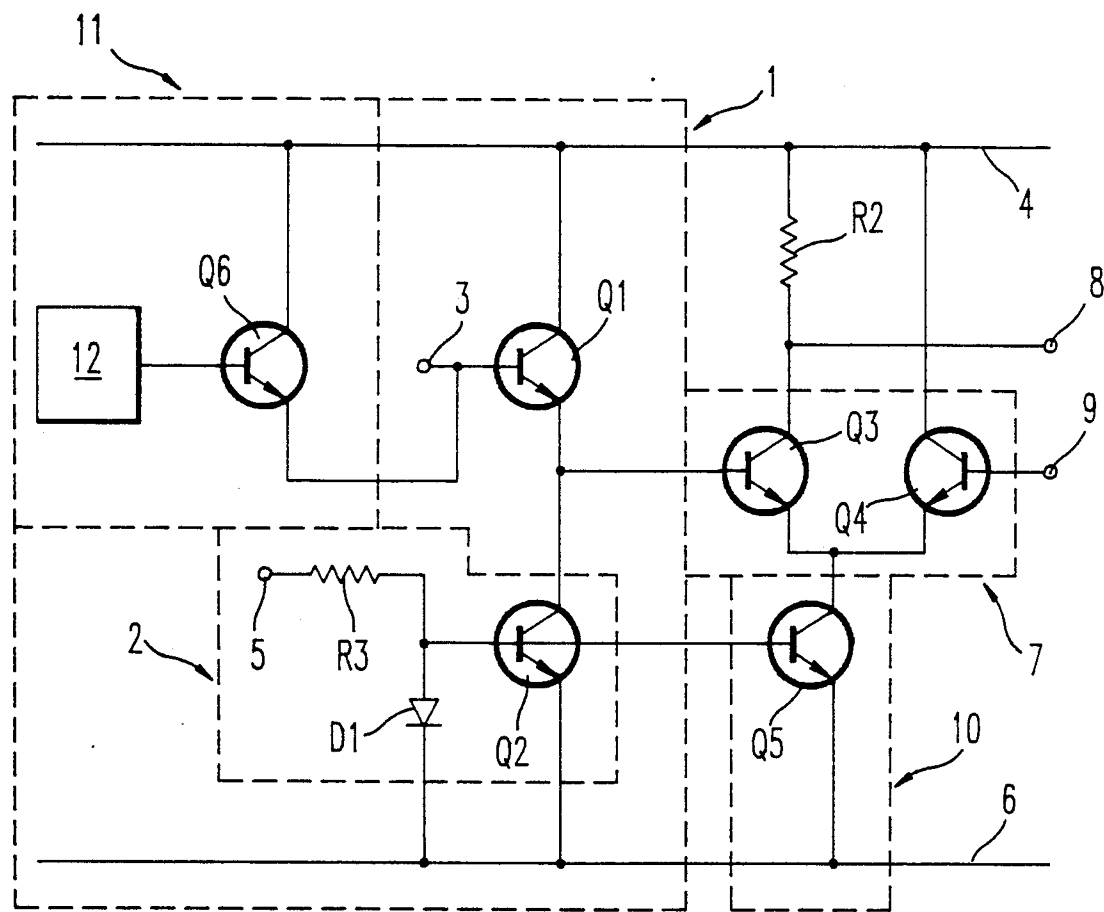
Figure 14:
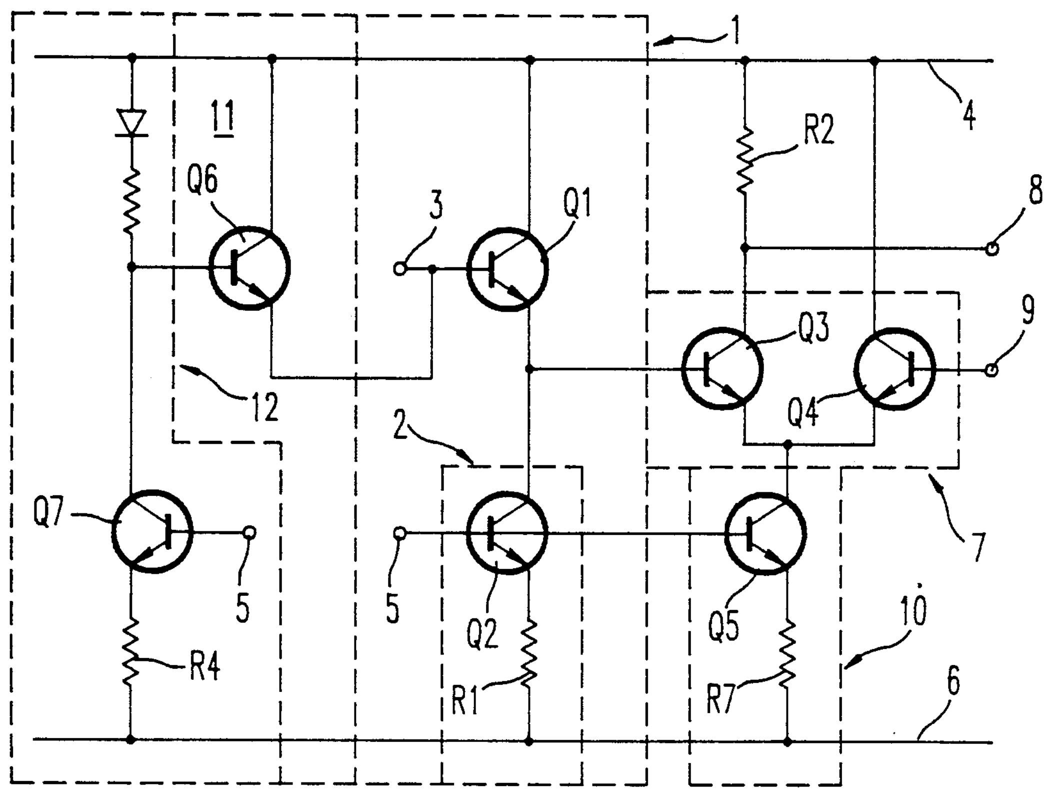
Figure 15:
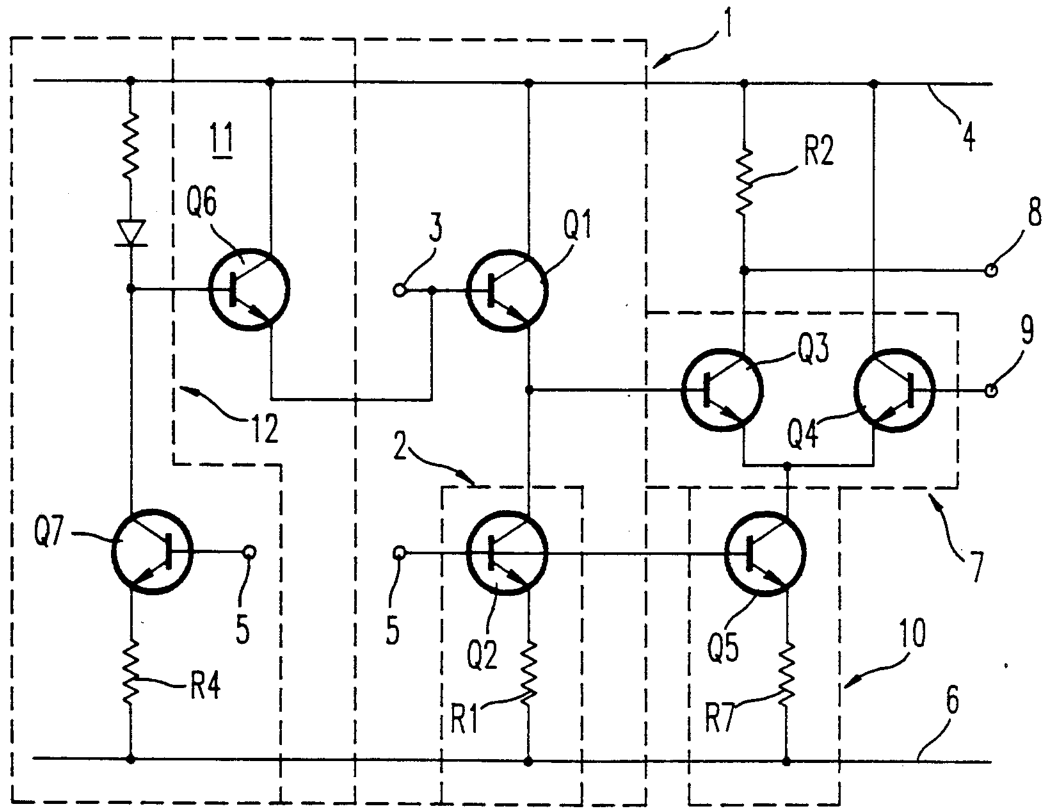
Figure 16:
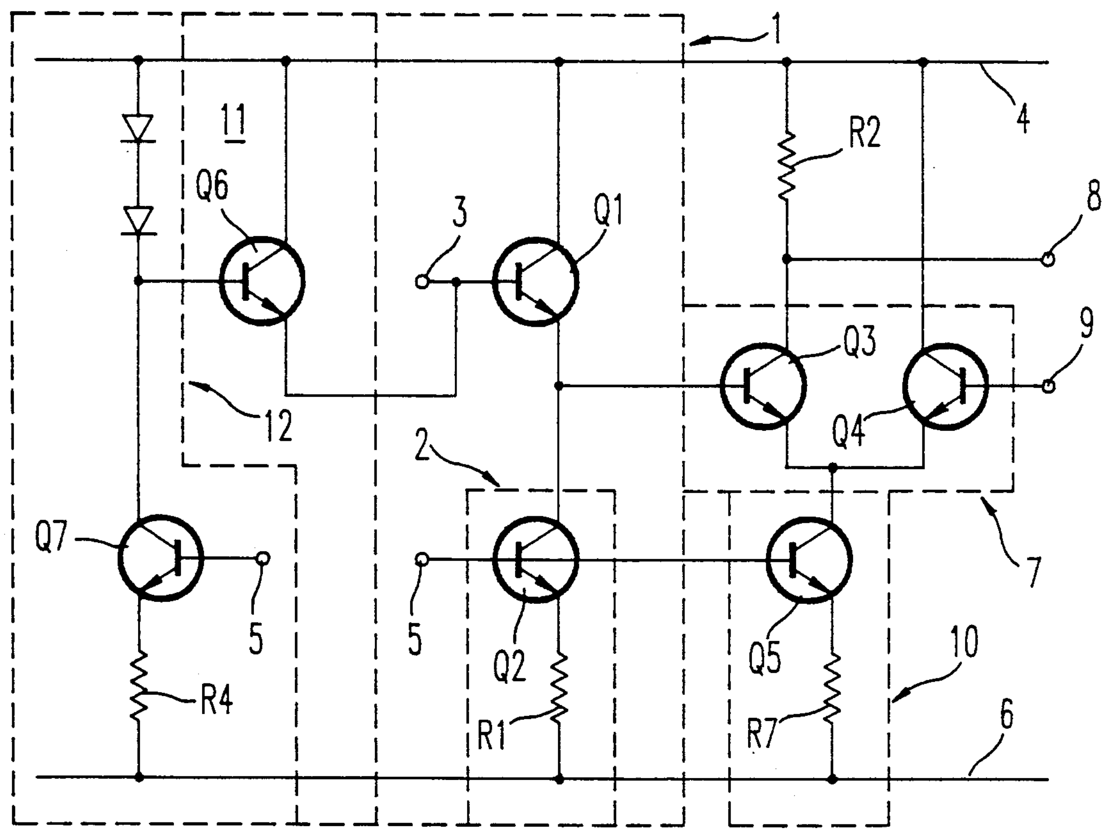

Also when the constant current source circuit 2 shown in FIG. 3 is implemented by a current mirror circuit FIG. 12 which is similar to that shown in FIG. 2, the emitter voltage of the transistor $Q_1$ is clamped at the output voltage of the clamp circuit 11 if the input terminal 3 is opened. Thus, the base potential of the transistor $Q_2$ is not changed since the current $I_0$ flows in the transistor $Q_2$ even if the input terminal 3 is opened. As the result, the current value of the constant current source 10, receiving the anode potential of the diode $D_1$ as reference voltage, is not changed and remains constant, whereby the semiconductor integrated circuit device can be stably operated with no regard to the state of connection of the input terminal 3.

Figure 4:
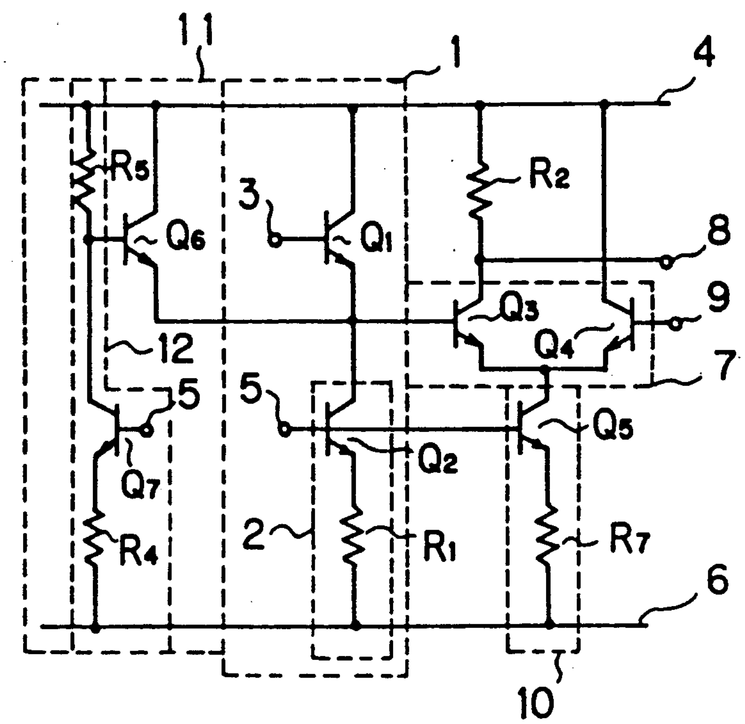
FIG. 4 to FIG. 16 are circuit diagrams showing other embodiments of the present invention.
Figure 9:
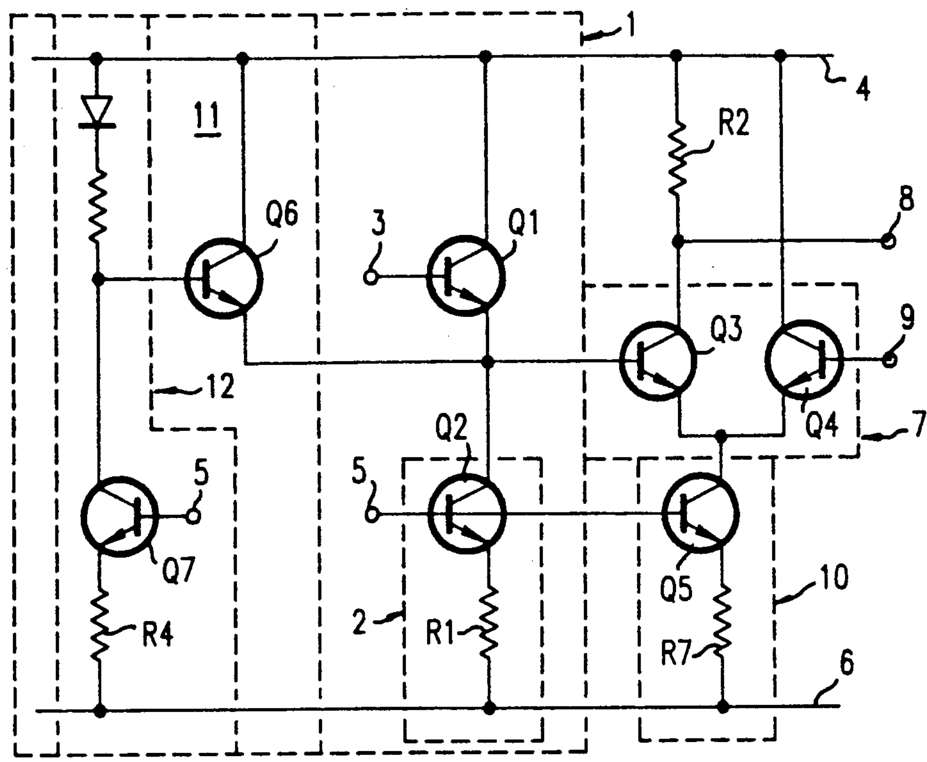
Figure 10:
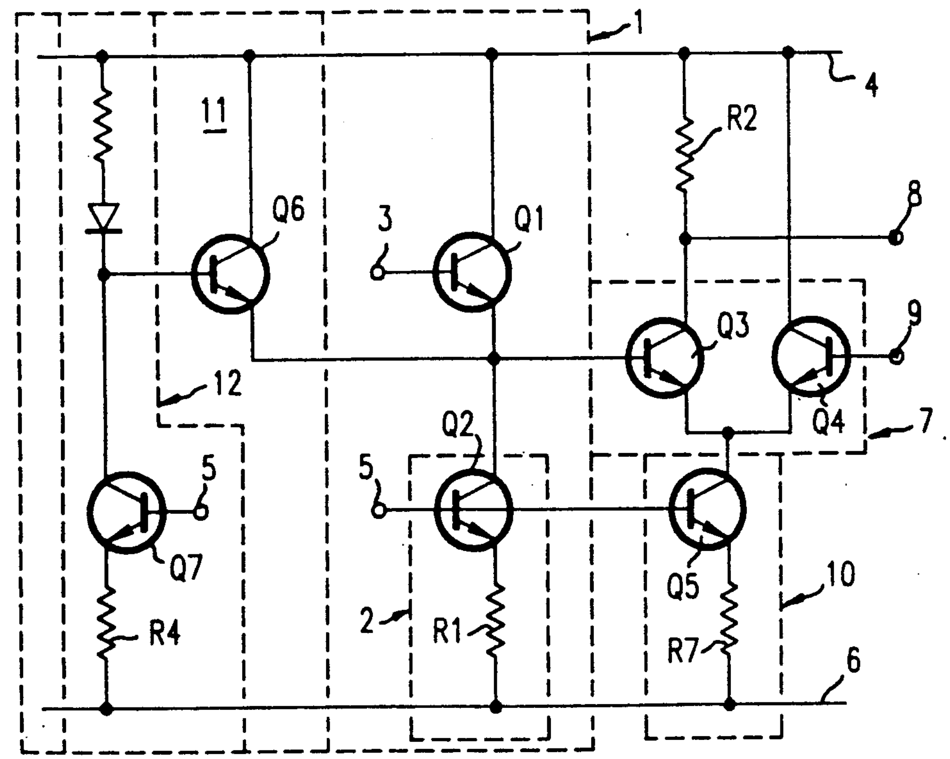
Figure 11:
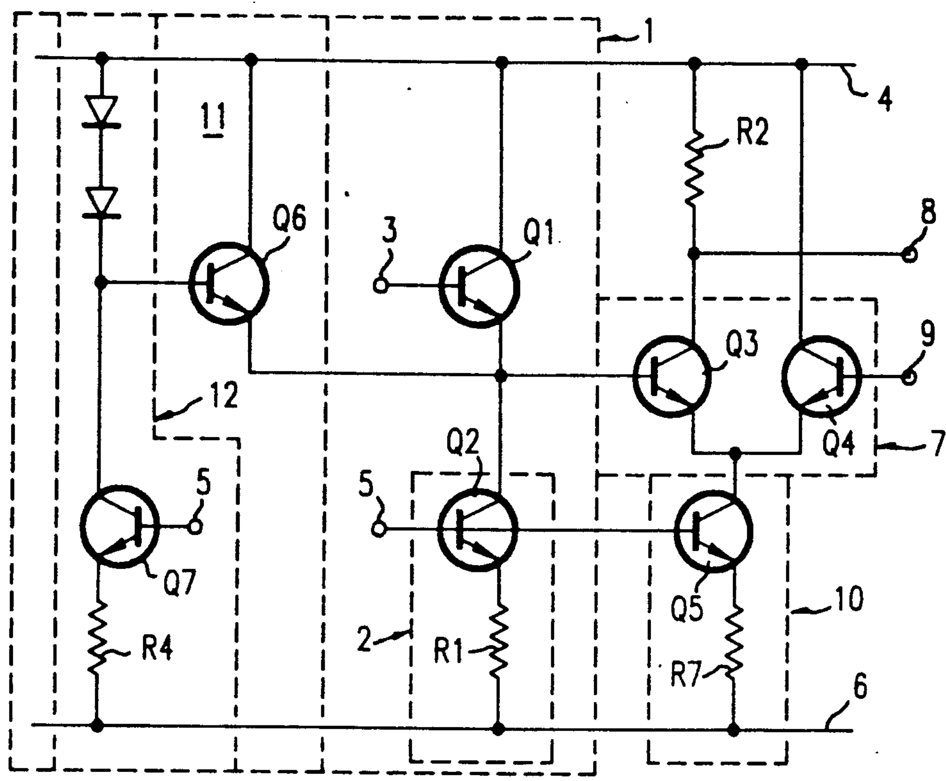

FIG. 4 is a circuit diagram showing exemplary structure of the constant voltage source 12 in the above embodiment. Referring to FIG. 4, the constant voltage source 12 is formed by a constant current source circuit consisting of a resistor $R_4$ and a transistor $Q_7$, and a resistor $R_5$. The transistor $Q_7$ has a base connected to a reference voltage input terminal 5, an emitter connected to a second power supply line 6 through the resistor $R_4$ and a collector connected to the base of the transistor $Q_6$ as well as to a first power supply line 4 through the resistor $R_5$. In this case, current flowing in the resistor $R_5$ can be made constant by the constant current source circuit formed by the reference voltage input terminal 5, the transistor $Q_7$ and the resistor $R_4$. Thus, a voltage drop at the resistor $R_5$ can be made constant and the base voltage of the transistor $Q_6$ can be maintained constant, to attain an effect similar to that of the above embodiment. Further, the resistor $R_5$ may be replaced by a diode series circuit (FIG. 11) or a series circuit of a diode and a resistor (FIGS. 9 and 10).

Figure 5:
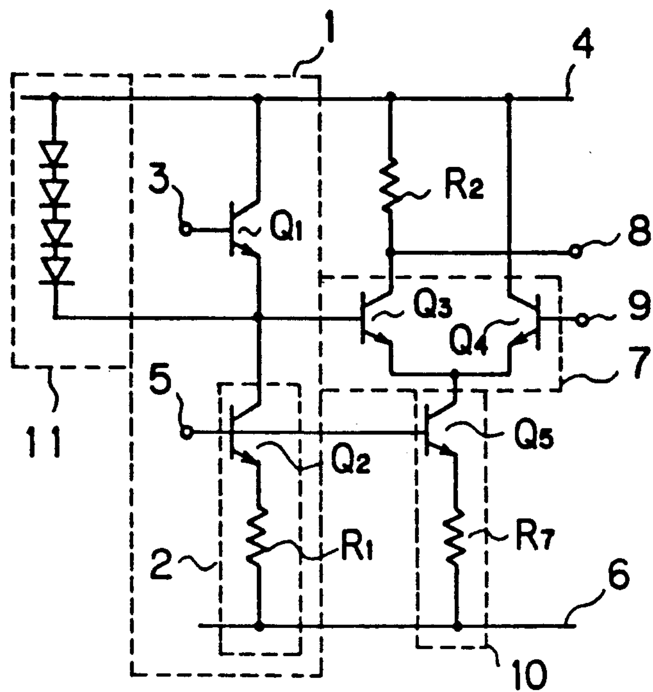

FIG. 5 is a circuit diagram showing still another embodiment of the present invention. While the clamp circuit 11 is formed by the transistor $Q_6$ and the constant voltage source 12 in each of the embodiments shown in FIGS. 3 and 4, a clamp circuit 11 is formed by a diode series circuit in the embodiment shown in FIG. 5. In this diode series circuit, an anode is connected to a first power supply line and a cathode is connected to an emitter of a transistor $Q_1$. When an input terminal 3 is opened, the diode series circuit is turned on so that emitter voltage of the transistor $Q_1$ can be clamped at a predetermined potential level by a voltage drop of the diodes, to thereby attain an effect similar to those of the aforementioned embodiments. The diode series circuit may be replaced by a series circuit of a diode and a resistor.

Figure 6:
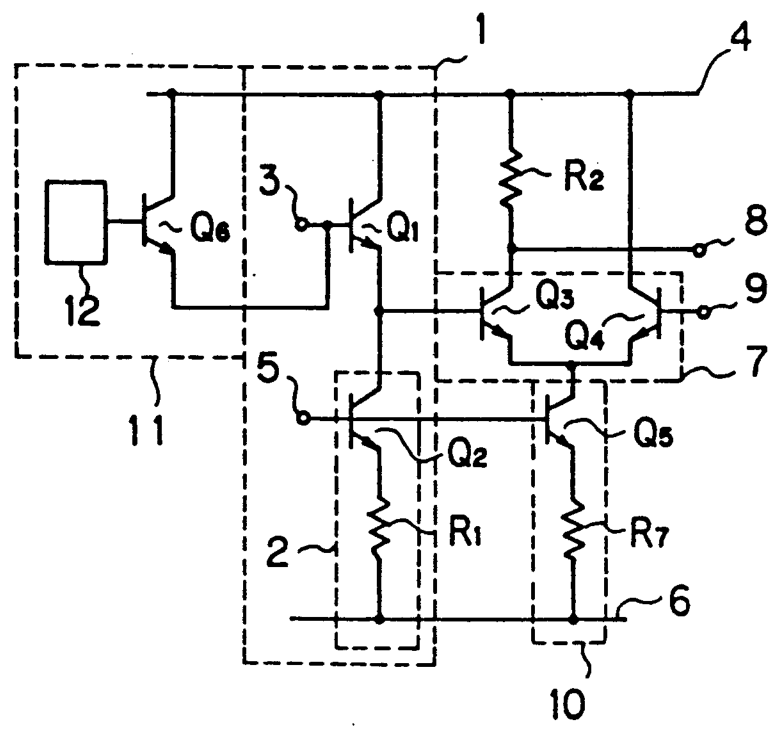

Although the clamp circuit 11 is connected to the emitter of the transistor $Q_1$ so that the constant current $I_0$ flows in the constant current circuit 2 with no regard to the input state of the input terminal 3 in each of the aforementioned embodiments, a similar effect can also be attained by connecting a clamp circuit 11 to the base of a transistor $Q_1$, as shown in FIG. 6. In this case, the potential of a constant voltage source 12 is set at a level lower than a low level of an input signal, to exert no influence on output when a high-level or low-level signal is received in the input terminal 3. When the input terminal 3 is opened, the base potential of the transistor $Q_1$ is clamped at the output potential of the clamp circuit 11. Therefore, the transistor $Q_1$ maintains its conducting state and constant current $I_0$ to a constant current source circuit 2 is supplied from a first power supply line 4, to attain an effect similar to those of the aforementioned embodiments.

Figure 7:
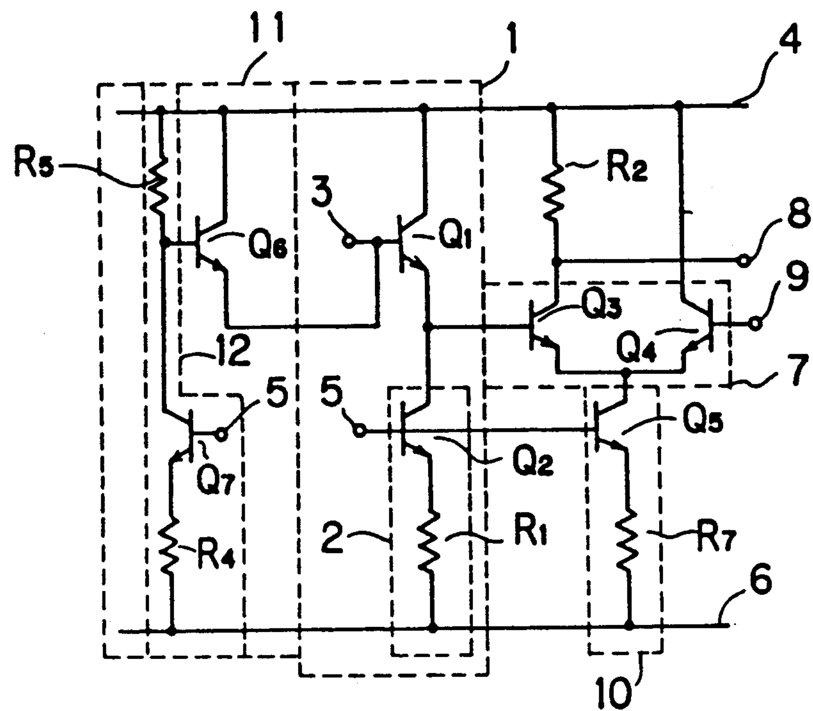
Figure 8:
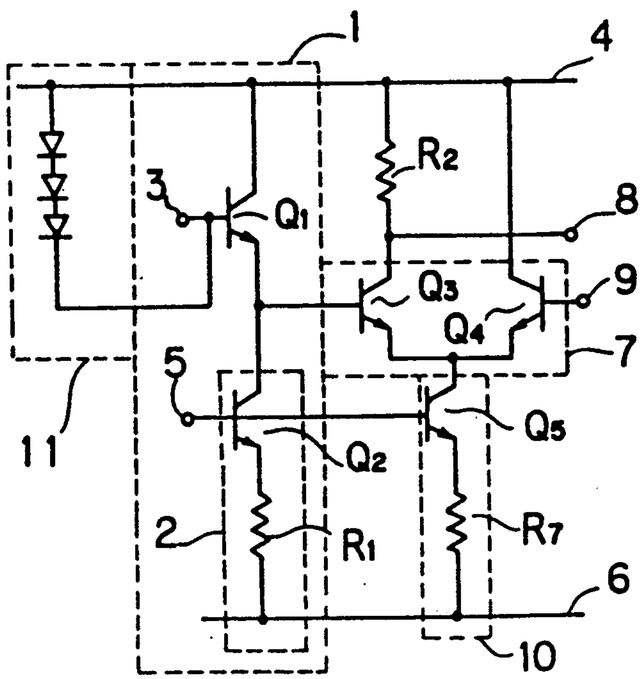

The constant voltage source 12 in FIG. 6 may be formed by resistors $R_4$ and $R_5$ and a transistor $Q_7$, as shown in FIG. 7, in a similar manner to that shown in FIG. 4. Further, the clamp circuit 11 in FIG. 6 may be formed by a diode series circuit, as shown in FIG. 8, in a similar manner to that shown in FIG. 5.

Additional embodiments are shown in FIGS. 9–16 in which different arrangements of the constant current source may be formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:

a buffer transistor, a base of said buffer transistor being connected to an input terminal;

clamp circuit means, having an output connected to the base of said buffer transistor, for maintaining a base potential of said buffer transistor at a level lower than a low level voltage inputted to said input terminal thereby to make said buffer transistor conductive when said terminal is opened;

a first supply line coupled to an input of said clamp circuit means, said first power supply line being connected to the collector of said buffer transistor; and a first constant current source connected to the emitter of said buffer transistor.

2. A semiconductor integrated circuit according to claim 1, wherein:

said clamp circuit means having a constant voltage source coupled to the base of a transistor, the emitter of said transistor coupled to the base of said buffer transistor.

3. A semiconductor integrated circuit device according to claim 1, wherein:

said clamp circuit means comprises a second transistor, the emitter of said second transistor coupled to the base of said buffer transistor; and a third transistor; the collector of said third transistor coupled to the base of said second transistor.

4. A device according to claim 3, wherein:

said clamp circuit means further comprises a resistor coupled to between said first power supply line and the base of said second transistor.

5. A semiconductor integrated circuit device according to claim 1, wherein:

said clamp circuit means comprises a plurality of diodes coupled in series, the output of said plurality of diodes coupled to the base of said buffer transistor.

6. A device according to claim 1, wherein said first constant current source comprises:

a resistor $R_1$, and a transistor $Q_2$, having a base connected to a voltage input terminal, the collector of transistor $Q_2$, coupled to the emitter of said buffer transistor and the emitter of transistor $Q_2$, coupled to resistor $R_1$, and to a second power supply line.

7. A device according to claim 6, further comprising:

a second constant current source coupled to the first constant current source.

8. A semiconductor integrated circuit device according to claim 7, wherein the second constant current source comprises:

a resistor $R_7$, and a transistor $Q_5$, having a base coupled to the base of the transistor $Q_2$, and the emitter of transistor $Q_5$, coupled to the second power supply line through said resistor $R_7$.

9. A device according to claim 8, further comprising:

an emitter coupled logic differential air pair coupled to the collector of said transistor $Q_5$.

10. A device according to claim 9, wherein:

the emitter logic coupled differential pair comprise transistors $Q_3$ and $Q_4$, the collector of the transistor $Q_3$, coupled to an output terminal and connected to the first power supply line through a resistor $R_2$, and the base of the transistor $Q_4$ coupled to a logic comparison input voltage terminal and the base of transistor $Q_3$ connected to the emitter of said buffer transistor terminal.

11. A semiconductor integrated circuit device, comprising:

a buffer transistor having a base, a collector and an emitter electrodes, the collector electrode of said buffer transistor being coupled to a first power supply line, the base electrode of said buffer transistor being coupled to an input terminal for receiving input signals having high level and low level;

a first constant current source connected between the emitter electrode of said buffer transistor and a second power supply line;

an emitter coupled logic differential pair having an input node, an output node, and a connecting node, the input node of said emitter coupled logic differential pair being connected to the emitter electrode of said buffer transistor;

a second constant current source connected between the connecting node of said emitter coupled logic differential pair and said second power supply line;

means for supplying current to said first constant current source when said input terminal does not receive said input signals.

12. A semiconductor integrated circuit device according to claim 11, wherein said emitter coupled logic differential pair comprises a pair of transistors, one of said pair of transistors having a base electrode connected to said input node, a collector electrode connected to said output node and to the first power supply line via a resistive element, and an emitter electrode connected to said connecting node, while the other of said pair of transistors having a base electrode receiving a logic comparison reference potential, a collector electrode coupled to the first power supply line, and an emitter electrode coupled to said connecting node.

13. A semiconductor integrated circuit device, comprising:

a buffer transistor having a base, a collector, and an emitter electrodes, collector electrode of said buffer transistor being coupled to a first power supply line, the base electrode of said buffer transistor being coupled to an input terminal for receiving an input signals having high level and low level;

a first constant current source coupled between the emitter electrode of said buffer transistor and a second power supply line;

an emitter coupled logic differential pair having an input node, an ouput node, and a connecting node, the input node of said emitter logic coupled differential pair being coupled to the emitter electrode of said buffer transistor;

a second constant current source connected to between the connecting node of said emitter coupled logic differential pair and said second power supply line; and means for supplying a potential lower than the low level of said input signals to the base electrode of said buffer transistor.

14. A semiconductor integrated circuit device according to claim 13, wherein said emitter coupled logic differential pair comprises a pair of transistors, one of said pair of transistors having a base electrode coupled to said input node, a collector electrode coupled to said output node and to said first power supply line via a resistive element, and an emitter electrode connected to said connecting node, while the other of said pair of transistors having a base electrode receiving a logic comparison reference potential, a collector electrode coupled to the first power supply line, and an emitter electrode coupled to said connecting node.

15. A semiconductor integrated circuit device according to claim 13, wherein said means for supplying a potential lower than the low level of said input signals comprises a transistor having a collector electrode coupled to said first power supply line, an emitter electrode coupled to the base electrode of said buffer transistor, and a base electrode receiving a predetermined potential.

16. A semiconductor integrated circuit device according to claim 13, wherein said means for supplying a potential lower than the low level of said input signals comprises a plurality of diodes coupled in series between said first power supply line and the base electrode of said buffer transistor.

17. A semiconductor integrated circuit device, comprising:

a buffer transistor having a base, a collector, and an emitter electrodes, the collector electrode of said buffer transistor being coupled to a first power supply line, the base electrode of said buffer transistor being coupled to an input terminal for receiving input signals having high level and low level;

at first constant current source connected between the emitter electrode of said buffer transistor and a second power supply line;

an emitter coupled logic differential pair having an input node, an output node, and a connecting node, the input node of said emitter coupled logic differential pair being coupled to the emitter electrode of said buffer transistor;

a second constant current source connected between the connecting node of said emitter coupled logic differential pair and said second power supply line; and means for supplying a potential, which is lower than the low level of said input signals applied to the base electrode of said buffer transistor, to a junction of the emitter electrode of said buffer transistor and said first constant current source.

18. A semiconductor integrated circuit device according to claim 17, wherein said means for supplying a potential comprises a transistors having a collector electrode coupled to said first power supply line, an emitter electrode coupled to an emitter electrode of said buffer transistor, and a base electrode receiving a predetermined potential.

19. A semiconductor integrated circuit device according to claim 17, wherein said emitter coupled logic differential pair comprises a pair of transistors, one of said pair of transistors having a base electrode coupled to said input node, a collector electrode coupled to said output node and to said first power supply line via resistive element, and an emitter electrode coupled to said connecting node, while the other of said pair of transistors having a base electrode receiving a logic comparison reference potential, a collector electrode coupled to said first power supply line, and an emitter electrode coupled to said connecting node.

20. A semiconductor integrated circuit device according to claim 17, wherein said first constant current source comprises a resistor and a transistor coupled in series between the emitter electrode of said buffer transistor and the second power supply line, the base electrode of said transistor receiving a predetermined potential.

21. A semiconductor integrated circuit device according to claim 17, wherein said second constant current source comprises a transistor connected between the connecting node of said emitter coupled logic differential pair and the second power supply line, the base electrode of said transistor receiving a predetermined potential.

22. A semiconductor integrated circuit device, comprising:

a buffer transistor having a base connected to an input terminal;

a clamp circuit means having an output coupled to the base of said buffer transistor and which includes a constant voltage source connected to the base of a transistor wherein said constant voltage source is comprised of a transistor connected between two resistors; a first power supply line connected to an input of said clamp circuit means, said first power supply line being connected to the collector of said buffer transistor;

a first constant source connected to the emitter of said buffer transistor; and a second power supply line connected to said firsts constant current source.

* * * * *